(12) United States Patent
Jang et al.

(10) Patent No.: US 8,514,135 B2
(45) Date of Patent: *Aug. 20, 2013

(54) PROTECTIVE CIRCUIT MODULE AND SECONDARY BATTERY PACK INCLUDING THE SAME

(75) Inventors: Youngcheol Jang, Yongin-si (KR);
Nohyun Kwag, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/564,641

(22) Filed: Aug. 1, 2012

(65) Prior Publication Data

US 2012/0293120 A1  Nov. 22, 2012

Related U.S. Application Data

(63) Continuation-in-part of application No. 13/220,566, filed on Aug. 29, 2011, now Pat. No. 8,259,013, which is a continuation of application No. 12/246,763, filed on Oct. 7, 2008, now Pat. No. 8,031,122.

(30) Foreign Application Priority Data

Oct. 30, 2007 (KR) .......................... 10-2007-109726

(51) Int. Cl.
*H01Q 11/12* (2006.01)

(52) U.S. Cl.
USPC ..................... 343/700 MS; 343/741; 343/866

(58) Field of Classification Search
USPC ................... 343/700 MS, 702, 741, 866, 895
See application file for complete search history.

(56) References Cited

U.S. PATENT DOCUMENTS

| | | |
|---|---|---|
| 6,492,058 B1 | 12/2002 | Watanabe et al. |
| 6,628,931 B1 | 9/2003 | Tomida |
| 7,122,276 B2 | 10/2006 | Gu |
| 7,439,933 B2 | 10/2008 | Uesaka |
| 7,562,445 B2 | 7/2009 | Learch et al. |
| 7,585,589 B2 | 9/2009 | Kim |
| 7,679,315 B2 | 3/2010 | Kim et al. |
| 7,736,800 B2 | 6/2010 | Lee |
| 7,859,480 B2 | 12/2010 | Shimizu |
| 7,935,439 B2 | 5/2011 | Kim |
| 2005/0142439 A1 | 6/2005 | Lee et al. |

(Continued)

FOREIGN PATENT DOCUMENTS

| | | |
|---|---|---|
| JP | 2000-174651 | 6/2000 |
| JP | 2001-228042 | 8/2001 |

(Continued)

OTHER PUBLICATIONS

English abstract of Korean Publication 10-1997-0072551, published Nov. 7, 1997.

(Continued)

*Primary Examiner* — Hoang V Nguyen

(74) *Attorney, Agent, or Firm* — Christie, Parker & Hale, LLP

(57) ABSTRACT

A protective circuit module including: an insulating substrate including a plurality of layers; first and second printed circuit patterns disposed between the plurality of layers of the insulating substrate; a loop antenna electrically coupled to the first printed circuit pattern; and a wireless charging portion spaced apart from the loop antenna and electrically coupled to the second printed circuit pattern, wherein ends of the loop antenna and ends of the wireless charging portion are between the plurality of layers of the insulating substrate.

17 Claims, 11 Drawing Sheets

(56) References Cited

U.S. PATENT DOCUMENTS

2006/0093905 A1 5/2006 Kim
2006/0263647 A1 11/2006 Moon et al.
2007/0011870 A1 1/2007 Lerch et al.
2007/0072071 A1 3/2007 Lee

FOREIGN PATENT DOCUMENTS

| KR | 10-1997-0072551 A | 11/1997 |
| KR | 10-0343898 | 6/2002 |
| KR | 10-2004-0075202 A | 8/2004 |
| KR | 10-2006-0110579 | 10/2006 |
| KR | 10-2006-0132345 A | 12/2006 |
| KR | 10-0944989 | 2/2010 |

OTHER PUBLICATIONS

Machine translation of JP 2000-174651, no date available.
SIPO Office action dated Apr. 6, 2011, for corresponding Chinese Patent application 200810171166.4, with English translation.
English-language abstract of KR 10-2000-0023068, no date available.
English-language abstract of KR 10-2006-0068119, no date available.

PROTECTIVE CIRCUIT MODULE AND SECONDARY BATTERY PACK INCLUDING THE SAME

CROSS-REFERENCE TO RELATED APPLICATION

This application is a continuation-in-part of U.S. patent application Ser. No. 13/220,566 filed on Aug. 29, 2011, which is a continuation of U.S. patent application Ser. No. 12/246,763, filed Oct. 7, 2008, which claims priority to and the benefit of Korean Application No. 2007-109726, filed Oct. 30, 2007 in the Korean Intellectual Property Office, the entire disclosures of all three of which are incorporated herein by reference.

BACKGROUND

1. Field of the Invention

Aspects of the present invention relate to a protective circuit module and a secondary battery pack including the same.

2. Description of the Related Art

Compact and light-weight mobile electric/electronic devices, such as cellular phones, notebook computers, and camcorders are currently being actively developed and produced. Such mobile electric/electronic devices have a battery pack mounted therein for portable operation. The battery pack includes a secondary battery that is capable of being recharged. Typical secondary batteries include Ni—Cd batteries, Ni-MH batteries, Li batteries, and Li-ion batteries. A Li-ion secondary battery has an operation voltage that is three times higher than that of a Ni—Cd battery or a Ni-MH battery. Further, a Li-ion secondary battery has a higher energy density per unit weight.

A secondary battery is electrically connected to a protective circuit module that controls the charging/discharging of the secondary battery and cuts of current flow when the secondary battery is overheated or experiences an over-current. Further, such a protective circuit module can include a loop antenna that is soldered thereto, so that it can perform an RFID function.

At this time, a problem may occur when a secondary battery that is manufactured with an injection molding material in a pack shape is soldered to a loop antenna. In particular, the coupling between the protective circuit module and the loop antenna can be deficient, which can lead to an increase in contact resistance.

SUMMARY

An aspect of the present invention is to provide a secondary battery pack having an improved coupling between a printed circuit pattern and a loop antenna.

According to aspects of the present invention, a protective circuit module includes: an insulating substrate; a printed circuit pattern formed on/in the substrate; and a loop antenna connected electrically to the printed circuit pattern.

According to aspects of the present invention, provided is a protective circuit module including: a printed circuit pattern; a charging/discharging terminal mounted on the insulating substrate and electrically connected to the printed circuit pattern; a protection circuit part mounted on the insulating substrate and electrically connected to the printed circuit pattern; and a loop antenna electrically connected to the printed circuit pattern.

According to aspects of the present invention, provided is a secondary battery pack, comprising: the protective circuit module; a secondary battery electrically connected to a charging/discharging path of the protective circuit module; and a coupling member to couple the loop antenna to the secondary battery.

According to aspects of the present invention, the secondary battery may be a can-type or a pouch-type secondary battery. The secondary battery may be coupled with the loop antenna, using an adhesive or a coupling member.

According to aspects of the present invention, the loop antenna may be coupled to the printed circuit pattern, by inserting the loop antenna among a plurality of layers formed on the insulating substrate.

According to aspects of the present invention, the loop antenna may be coupled to a portion of the printed circuit pattern that protrudes from the insulating substrate.

According to aspects of the present invention, the loop antenna may be an RFID antenna. The loop antenna may include a conductive copper film, or a conductive wire, that is electrically connected to the printed circuit pattern. The wire or film may be coated with an insulator. The insulator may be an insulating film.

According to aspects of the present invention, the loop antenna may be formed as a continuous loop, which can have various shapes.

Additional aspects and/or advantages of the invention will be set forth in part in the description which follows and, in part, will be obvious from the description, or may be learned by practice of the invention.

According to one embodiment of the present invention, a protective circuit module includes: an insulating substrate including a plurality of layers; first and second printed circuit patterns disposed between the plurality of layers of the insulating substrate; a loop antenna electrically coupled to the first printed circuit pattern; and a wireless charging portion spaced apart from the loop antenna and electrically coupled to the second printed circuit pattern, wherein ends of the loop antenna and ends of the wireless charging portion are between the plurality of layers of the insulating substrate.

The wireless charging portion may include a conductive coil.

The loop antenna and the wireless charging portion may be located on the first and second insulation films, respectively.

The ends of the wireless charging portion may be located on a lower surface of the first insulation film.

The second insulation film may be located on an upper surface of the loop antenna.

The protective circuit module may further include a conductive pattern located at a region of the first or second insulation film between the loop antenna and the wireless charging portion.

The loop antenna and the wireless charging portion may be located on one of the first and second insulation films.

The ends of the wireless charging portion may be located on the upper surface of the loop antenna and a third insulation film is located below the ends of the wireless charging portion.

The ends of the wireless charging portion may be located on the upper surface of the loop antenna and an insulation film may be located on lower surfaces of the ends of the wireless charging portion.

According to another embodiment of the present invention, a secondary battery pack includes: a protective circuit module including: an insulating substrate including a plurality of layers; first and second printed circuit patterns disposed between the plurality of layers of the insulating substrate; a charging/discharging terminal mounted on the insulating substrate and electrically coupled to the first and second printed circuit patterns; a protection circuit part mounted on the insulating substrate and electrically coupled to the first and second printed circuit patterns; a loop antenna electrically coupled to the first printed circuit pattern; and a wireless charging portion spaced apart from the loop antenna and electrically coupled to the second printed circuit pattern; a secondary battery electrically coupled to the protection circuit module; and a coupling member coupling the loop antenna and the wireless charging portion to the secondary battery, wherein ends of the loop antenna and ends of the wireless charging portion are between the plurality of layers of the insulating substrate and connected to the first and second printed circuit patterns.

The wireless charging portion may include a conductive coil.

The loop antenna and the wireless charging portion may be located on first and second insulation films, respectively.

The ends of the wireless charging portion may be located on a lower surface of the first insulation film.

The ends of the wireless charging portion may be located on an upper surface of the second insulation film of the loop antenna.

The secondary battery pack may further include a conductive pattern located at a region of the first or second insulation film positioned between the loop antenna and the wireless charging portion.

The loop antenna and the wireless charging portion may be located on one of the first and second insulation films.

The ends of the wireless charging portion may be located on the upper surface of the loop antenna and a third insulation film may be located below the ends of the wireless charging portion.

BRIEF DESCRIPTION OF THE DRAWINGS

These and/or other aspects and advantages of the invention will become apparent and more readily appreciated from the following description of the exemplary embodiments, taken in conjunction with the accompanying drawings, of which.

DETAILED DESCRIPTION

Figure 1A:
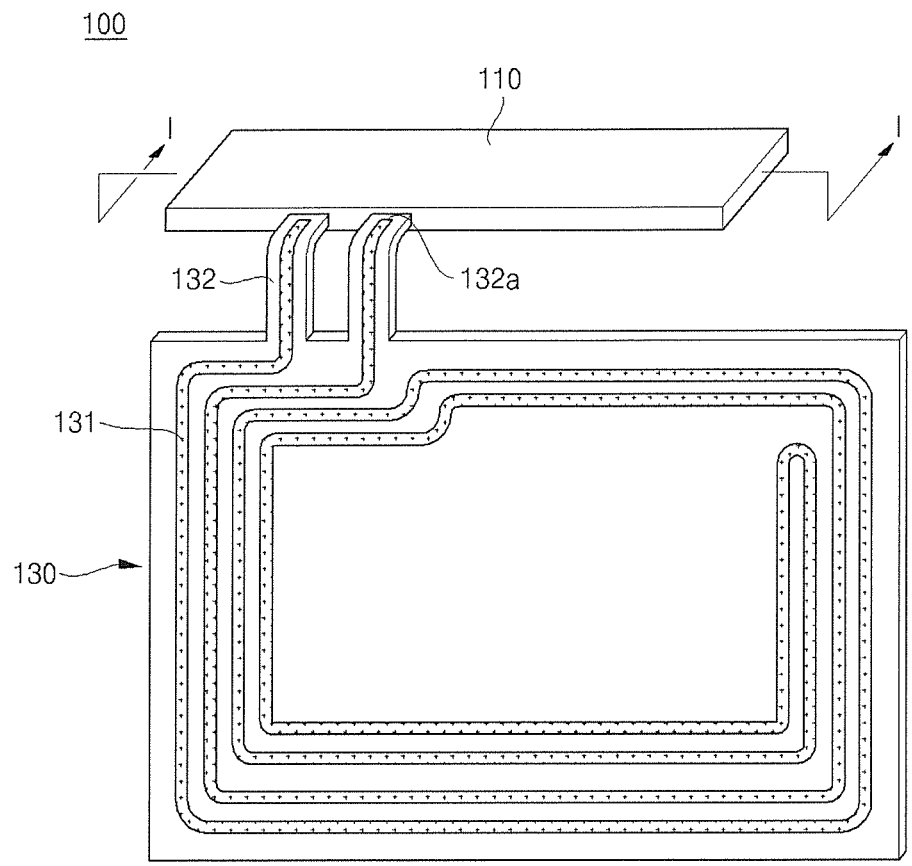
FIG. 1A is a perspective view of a protective circuit module, in accordance with one exemplary embodiment of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

Figure 1B:
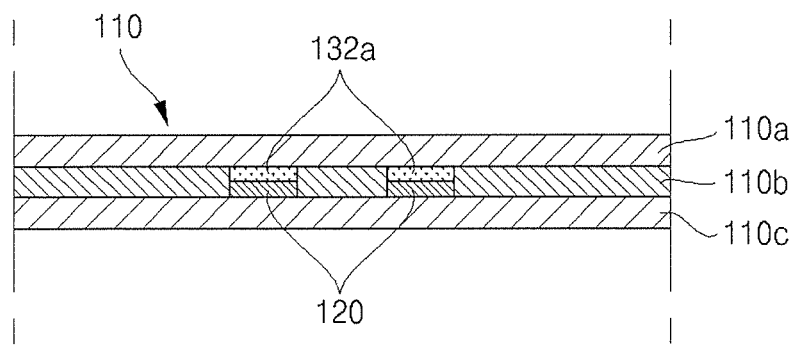
FIG. 1B is a cross-sectional view taken along line I-I of FIG. 1A.

FIG. 1A is a perspective view of a protective circuit module 100, in accordance with an exemplary embodiment of the present invention. FIG. 1B is a cross-sectional view taken along line I-I of FIG. 1A. Referring to FIGS. 1A and 1B, the protective circuit module 100 includes an insulating substrate 110 and a loop antenna 130.

The insulating substrate 110 includes a plurality of layers. As shown in FIG. 1B, the insulating substrate 110 can include an upper layer 110a, an intermediate layer 110b, and a lower layer 110c. The insulating substrate 110 may be formed of an epoxy or Bakelite resin, but is not limited thereto.

A printed circuit pattern 120 can be formed in the intermediate layer 110b, or among any of the layers of the insulating substrate 110. The printed circuit pattern 120 can be formed of a conductive material, such as a copper film, or the like. The printed circuit pattern 120 can also extend to the upper or lower surface of the insulating substrate 110, in order to facilitate a connection to an electrical device. The printed circuit pattern 120 is mounted in the insulating substrate 110, when the insulating substrate 110 is formed, and is bonded to the insulating substrate 110 with a strong coupling force, for example, by heating and pressing upper/lower portions of the insulating substrate 110.

The loop antenna 130 is electrically connected to the printed circuit pattern 120. The loop antenna 130 can be formed of a conductive wire, or a conductive copper film 131, but is shown as a conductive film in FIG. 1A. The loop antenna 130 is inserted into the substrate 110, and electrically connected to the printed circuit pattern 120.

Referring to FIG. 1B, ends 132a of the loop antenna 130 are inserted between the layers 110a, 110b, and 110c of the insulating substrate 110. The ends 132a are then electrically connected to the printed circuit pattern 120. In particular, the ends 132a are positioned on the lower layer 110c, before the intermediate layer 110b and upper layer 110 are stacked thereon and compressed. That is, the ends 132a of the loop antenna can be integrated with the printed circuit pattern 120, when the layers 110a, 110b, and 110c are pressed together.

The coupling of the loop antenna 130 and the printed circuit pattern 120 can be strengthened, by disposing the coupling between the layers 110a, 110b, and 110c of the insulating substrate 110. Further, since the ends 132a of the loop antenna 130 are disposed within the insulating substrate 110, interference, due to current flowing on the upper/lower surfaces of the insulating substrate 110, can be reduced. Further, because a soldering process is not used to couple the loop antenna 130 to a surface of the insulating substrate 110, the processing time thereof, can be reduced.

The loop antenna 130 may be an RFID antenna. The loop antenna 130 can be used to transmit an RFID signal to an external device. The RFID signal may include information relating to the type, shape, and production date of a mobile electronic device or a secondary battery. By changing the impedance of the loop antenna, the magnetic force of the loop antenna 130 is changed. Therefore, it is possible to detect the information, by measuring the changed magnetic force of the loop antenna 130. However, the present invention is not limited to the RFID aspects of the loop antenna 130.

The loop antenna 130 can be formed of a conductive wire (not shown) or conductive copper film 131. The path of the loop antenna 130 can be arranged in various shapes, so as to receive an RFID signal. The loop antenna 130 may have a circular shape, to increase the sensitivity and reduce the size of the loop antenna 130.

The loop antenna 130 can be coated with an insulator 132. The insulator 132 can be formed of a polyethylene or polypropylene resin, however, the present invention is not limited thereto. The insulator 132 may be an insulating film formed around the conductive wire or conductive copper film 131. The insulating film allows the loop antenna 130 to be easily attached to the surface of an electronic device or battery pack.

Figure 2A:
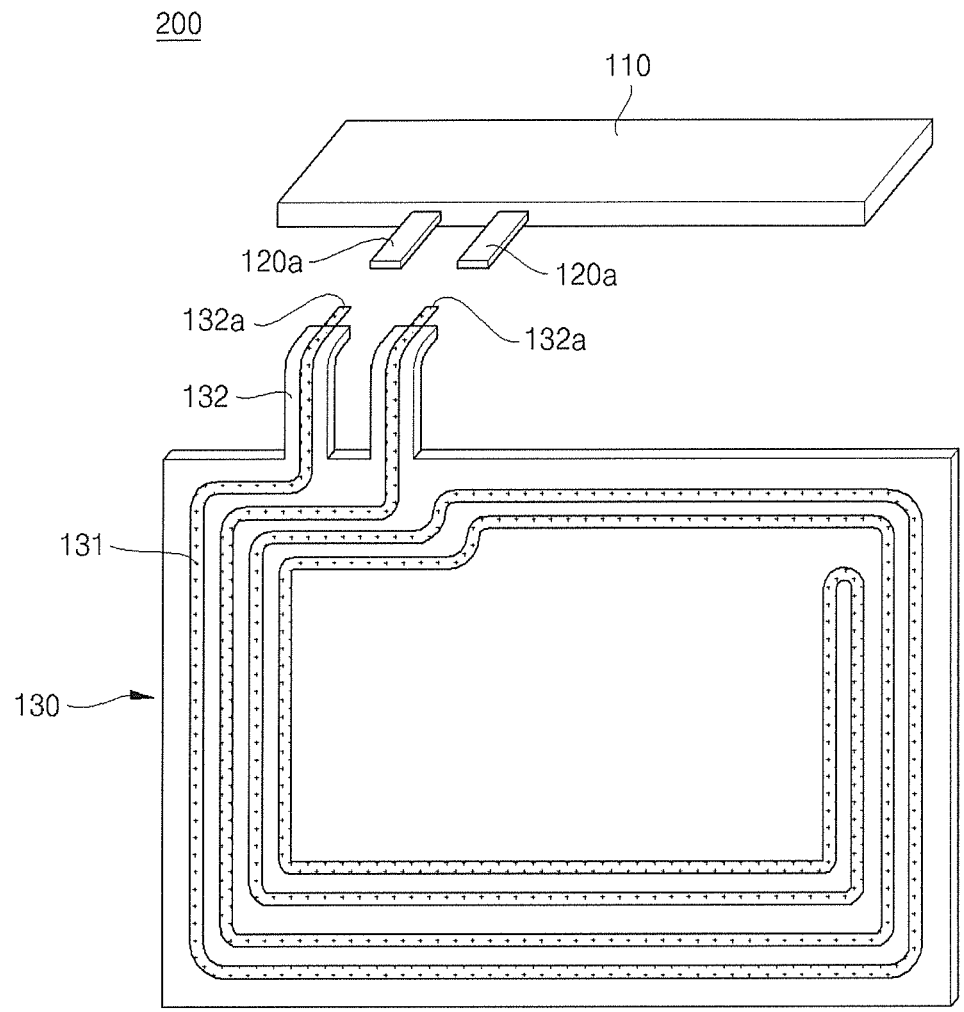
FIG. 2A is an exploded perspective view of a protective circuit module, in accordance with another exemplary embodiment of the present invention.
Figure 2B:
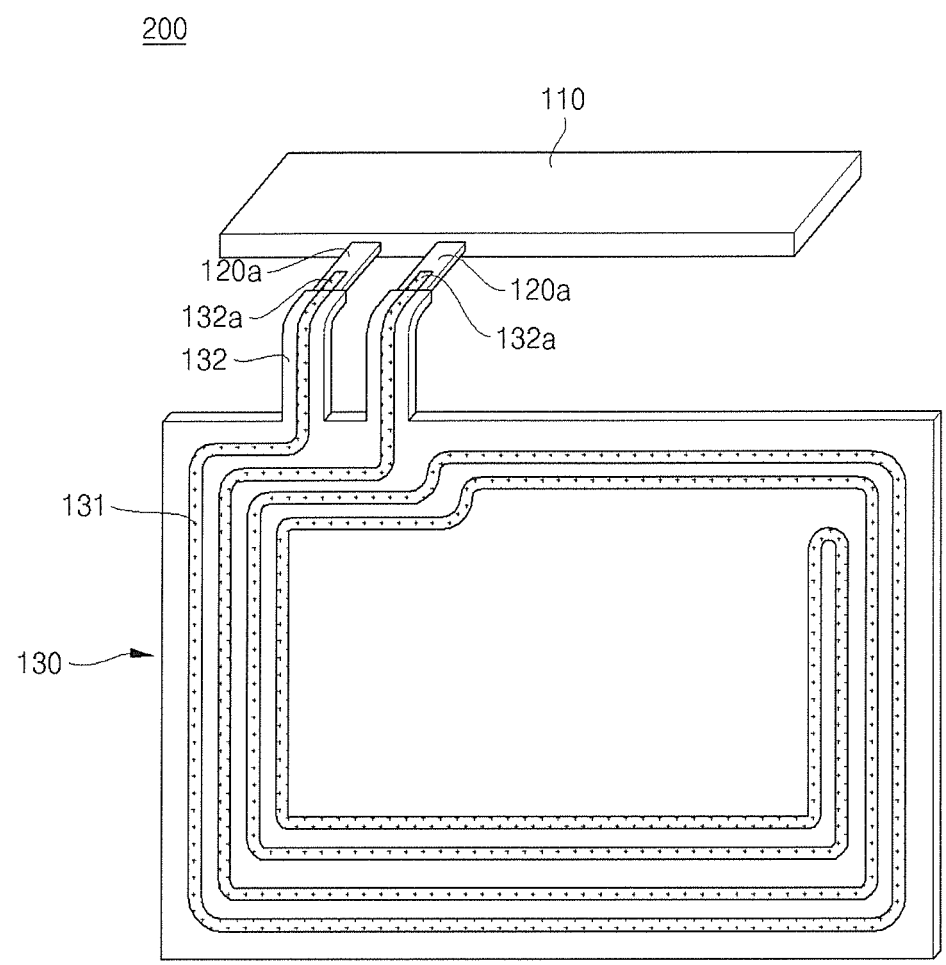
FIG. 2B is a perspective view illustrating the protective circuit module of FIG. 2A, as assembled.

FIG. 2A is an exploded perspective view of a protective circuit module 200, in accordance with another exemplary embodiment of the present invention. FIG. 2B is a perspective view of the protective circuit module 200 of FIG. 2A, as assembled.

Referring to FIGS. 2A and 2B, the protective circuit module 200 includes an insulating substrate 110, a printed circuit pattern 120a, and a loop antenna 130. A detailed description of the insulating substrate 110, the printed circuit pattern 120, and the loop antenna 130 is omitted, since these elements are similar to those described above.

Portions 120a of the printed circuit pattern 120 extend out of the insulating substrate 110. Ends 132a of the loop antenna 130 are electrically connected to the portions 120a. The ends 132a can be coupled to the portions 120a, by soldering, resistance welding, or ultrasonic welding, for example. The portions 120a generally extend far enough, so as to overlap the ends 132a, which can facilitate coupling. The portions 120a can be thicker than other parts of the printed circuit pattern 120. Therefore, the loop antenna 130 can be strongly coupled with the printed circuit pattern 120.

Figure 3A:
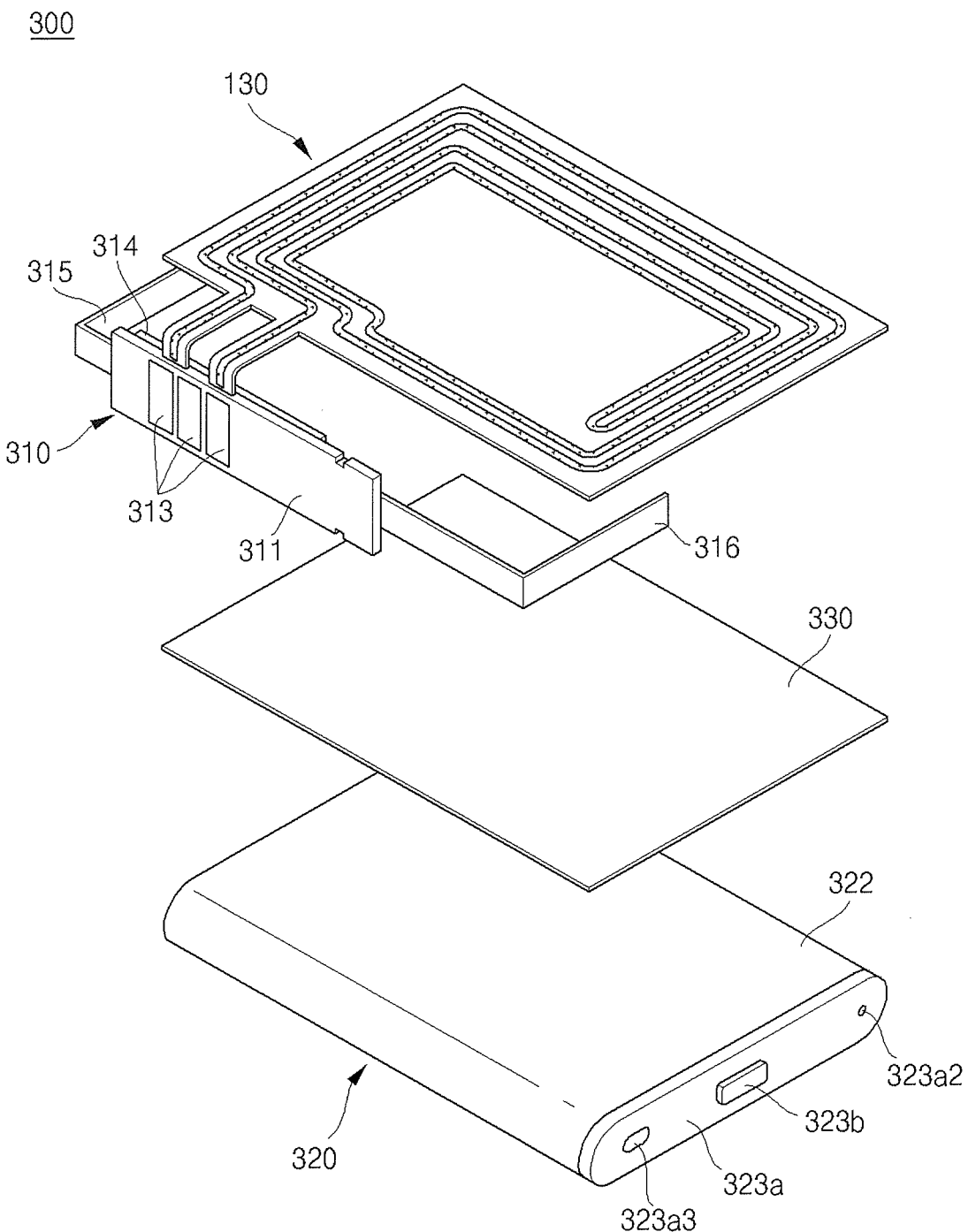
FIG. 3A is an exploded perspective view of a secondary battery pack, in accordance with still another exemplary embodiment of the present invention.
Figure 3B:
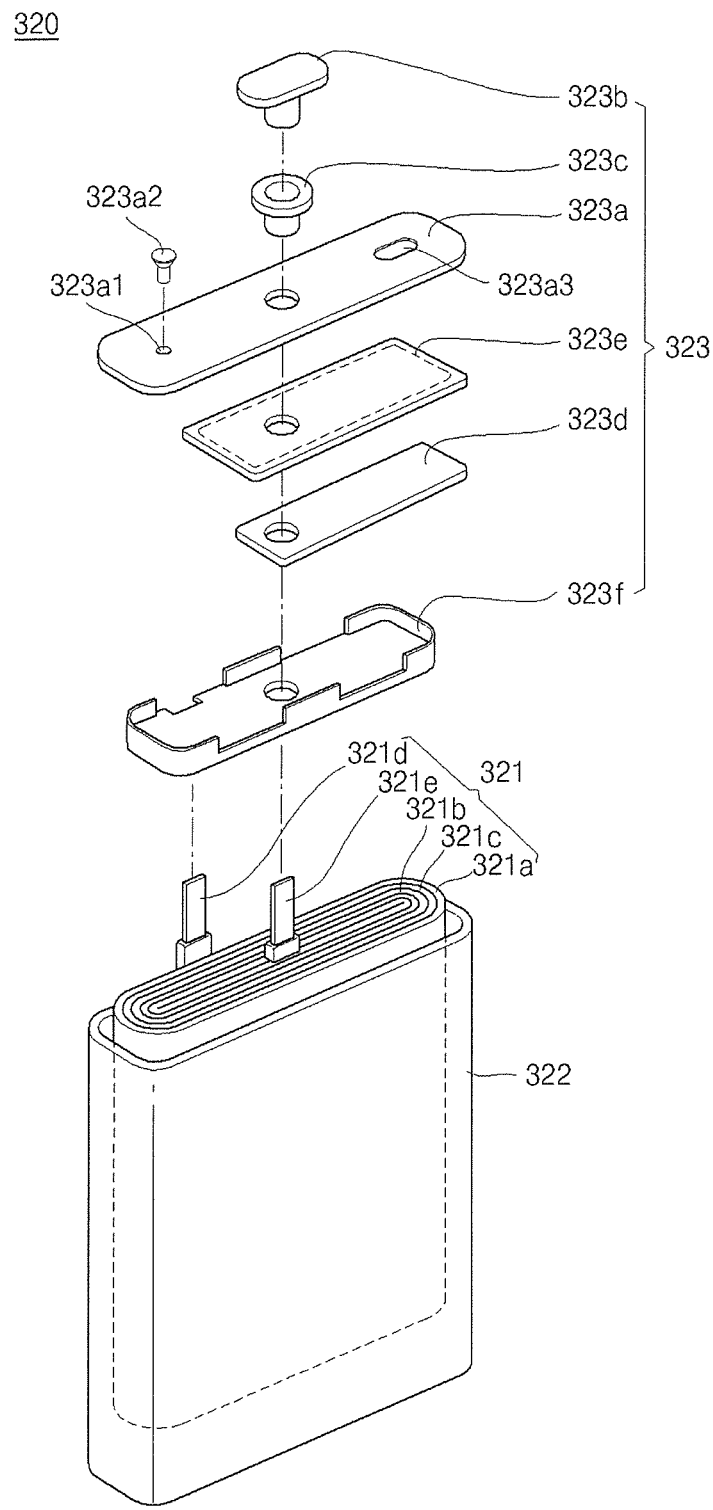
FIG. 3B is an exploded perspective view of a secondary battery of FIG. 3A.

FIG. 3A is an exploded perspective view of a secondary battery pack 300, in accordance with an exemplary embodiment of the present invention. FIG. 3B is an exploded perspective view of a secondary battery 320 of FIG. 3A. The secondary battery 320 is a can-type secondary battery; however, the present invention is not limited thereto. Referring to FIGS. 3A-3B, the secondary battery pack 300 includes a protective circuit module 310, the secondary battery 320, and a coupling member 330.

The protective circuit module 310 includes an insulating substrate 311, a printed circuit pattern (not shown), a charging/discharging terminal 313, a protection circuit part 314, and a loop antenna 130. The insulating substrate 311 can include a plurality of layers, as described with reference to FIG. 1B, and can be formed of an epoxy or Bakelite resin. However, the present invention is not limited thereto.

The charging/discharging terminal 313 can be formed on the upper surface of the insulating substrate 311 and can be electrically connected to the printed circuit pattern. The charging/discharging terminal 313 can include 3 separate terminals, as shown in FIG. 3A. Two of the terminals can be connected to positive and negative electrodes of the secondary battery 320, and one of the terminals can be used to detect information about the battery, such as a battery temperature, or a charge amount. As such, the charging/discharging terminal 313 can be used to electrically connect the secondary battery 320 to a charger (not shown) or a mobile electronic device (not shown).

The protection circuit part 314 can include a passive element (not shown), an active element (not shown), and/or a protection circuit (not shown), and can be electrically soldered to the printed circuit pattern. The passive element may be a resistor or a condenser, and can be electrically coupled with the printed circuit pattern, using a coupling method such as soldering. The passive element can filter signals, buffer voltage and current, and/or provide resistance information to the charger or external device.

The active element can be a field effect transistor (MOSFET), or a transistor that serves as a switch for an electrical connection to the external device. The active element can include a parasitic diode, and a voltage, current, or temperature sensing element. A power supply element may be used to supply power to the protection circuit. These elements may be in the form of an integrated circuit. A thermal fuse, a thermal breaker, and/or a PTC safety element may be included in the protection circuit part 314.

The protection circuit part 312 manages the charging/discharging of the secondary battery 320, by detecting the charge of the secondary battery, or selecting a suitable charging scheme. The protection circuit part 312 stores information on voltage, current, temperature, and/or charge of the secondary battery 320, and transmits this information to an the external device.

The secondary battery 320 may be coupled with the loop antenna 130, by the coupling member 330. Further, a positive electrode and a negative electrode of the secondary battery 320 are electrically connected to the protective circuit module 310, by a positive connector tab 315 and a negative connector tab 316. The secondary battery 320 may be a lithium ion battery, or a lithium polymer battery, for example.

As shown in FIG. 3B, the secondary battery 320 includes an electrode assembly 321 that is inserted into a can 322. The electrode assembly 321 may be formed by stacking and spirally winding a positive electrode plate 321a, a negative electrode plate 321b, and a separator 321c disposed therebetween. The positive electrode plate 321a is connected to a positive electrode tab 321d. The negative electrode plate 321b is connected to a negative electrode tab 321e. An opening of the can 322 is sealed with a cap assembly 323.

Referring to FIG. 3B, the positive electrode plate 321a includes a positive current collector that is coated with a positive active material. The positive active material may include lithium, a binder to enhance coherence, and a conductive material to enhance conductivity. The positive current collector is generally formed of aluminum foil. The positive electrode tab 321d is attached to an uncoated portion of the positive current collector.

The negative electrode plate 321b includes a negative current collector that is coated with a negative active material. The negative active material may include a hard carbon such as graphite, and a binder to enhance the coherence of the negative active material. The negative current collector may be formed of copper foil. The negative electrode tab 321e is attached to an uncoated portion of the negative current collector.

The separator 321c insulates the positive electrode plate 321a from the negative electrode plate 321b and is permeable to ions. Generally, the separator 321c may be formed of polyethylene (PE) or polypropylene (PP), but the present invention is not limited thereto. The separator 321c may include a polymer electrolyte.

The can 322 may be rectangular or cylindrical, in consideration of the shape of the electrode assembly 321. The can 322 houses the electrode assembly 321 and is sealed by the cap assembly 323. Generally, the can 322 may be formed of aluminum, but the present invention is not limited thereto.

The cap assembly 323 may include a cap plate 323a, an electrode terminal 323b, an insulating gasket 323c, a terminal plate 323d, an insulating plate 323e, and an insulation case 323f. The cap plate 323a includes a safety vent 323a3 and seals an opening of the can 322. The cap plate includes an electrolyte injection hole 323a1, through which an electrolyte is injected into the can 322. The electrolyte injection hole 323a1 is sealed by an electrolyte injection hole cap 323a2. The negative electrode tab 321d is electrically connected to the cap plate 323a.

The electrode terminal 323b is mounted on a center hole of the cap plate 323a and is connected electrically to the negative electrode tab 321e. The insulating gasket 323c insulates the electrode terminal 321e from the cap plate 323a.

The terminal plate 323d includes a hole that helps to secure the electrode terminal 323b. The terminal plate 323d may be electrically connected to the negative electrode tab 321e. The insulating plate 323e insulates the terminal plate 323d from the cap plate 323a. The insulation case 323f includes a groove and a hole, through which the positive electrode tab 321d and the negative electrode tab 321e project. The insulation case 323f is securely mounted on the electrode assembly 321, so as to insulate the upper surface of the electrode assembly 321.

The insulation gasket 323c, the insulation case 323f, and the insulation plate 323e may be formed of an insulating material, such as a polypropylene resin or a polyethylene resin. The electrode terminal 323b, cap plate 323a, and terminal plate 323d may be formed of a conductive material, such as aluminum, an aluminum alloy, nickel, or a nickel alloy. However, the present invention is not limited to the above materials.

The coupling member 330 couples the secondary battery 320 to the loop antenna 130. The coupling member 330 may be formed of a double coated tape. The coupling member 330 may be an adhesive that is applied between the secondary battery 320 and the loop antenna 130.

The coupling of the loop antenna 130 and the protective circuit module 310 is enhanced, since the loop antenna 130 and the secondary battery 320 are coupled using the coupling member 330. In addition, the loop antenna 130 may be inserted into the protective circuit module 310. Accordingly, when the loop antenna 130 is attached to the secondary battery 320, an injection molding operation may be performed to further secure the loop antenna 130 to the secondary battery 320.

Figure 4A:
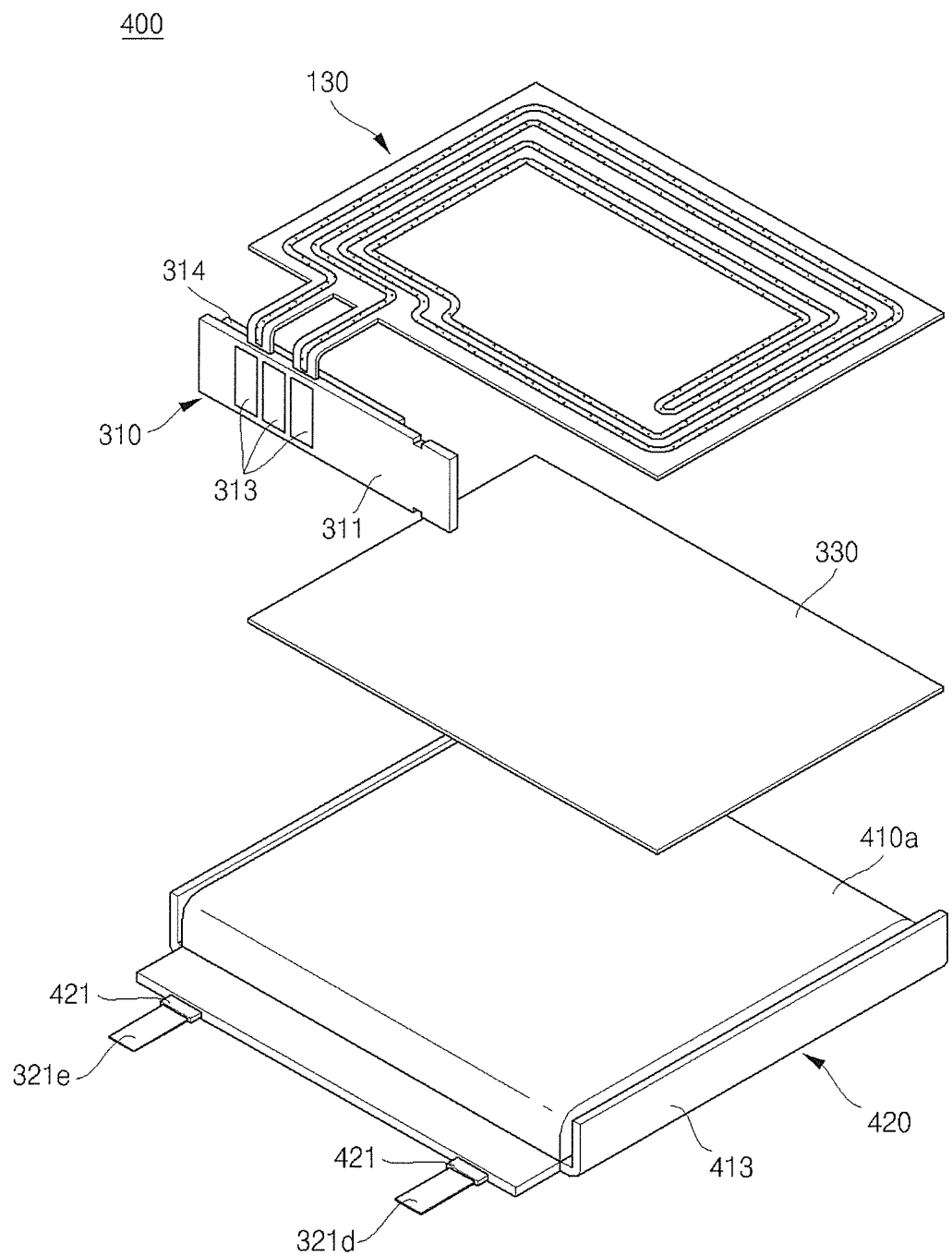
FIG. 4A is an exploded perspective view of a secondary battery pack, in accordance with still another exemplary embodiment of the present invention.
Figure 4B:
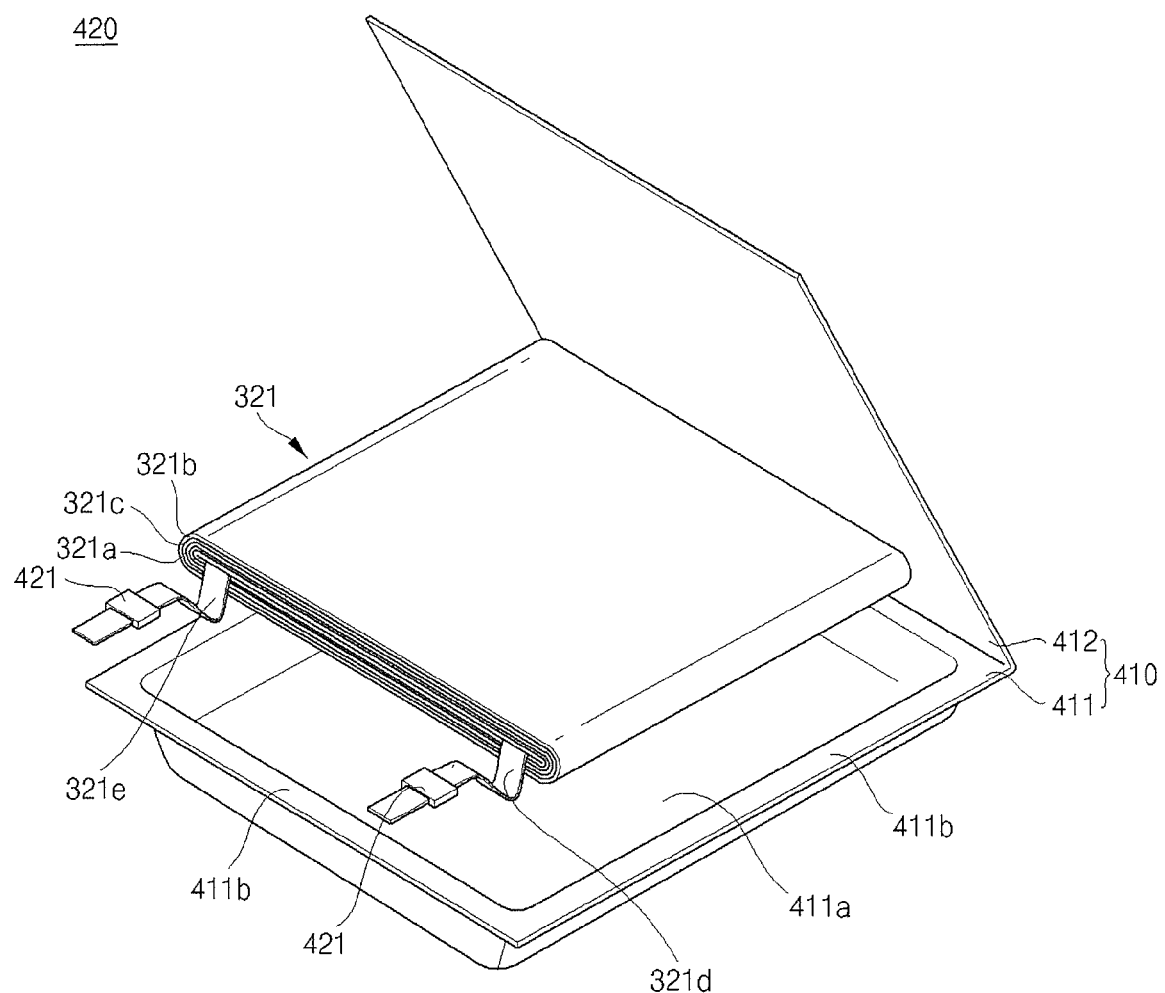
FIG. 4B is an exploded perspective view of the secondary battery pack of FIG. 4A.

FIG. 4A is a perspective view of a secondary battery pack 400, in accordance with still another exemplary embodiment of the present invention. FIG. 4B is a perspective view of a secondary battery 420 of FIG. 4A. As shown in FIG. 4A, the secondary battery pack 400 is similar to the battery pack 300, except that the secondary battery 420 is a pouch-type secondary battery, rather than a can-type secondary battery. In particular, the secondary battery 420 includes a pouch 410, an electrode assembly 321 that is inserted into the pouch 410, a protective circuit module 310, and a loop antenna 130.

The electrode assembly 321 includes a positive electrode tab 321d and a negative electrode tab 321e, which extend through the pouch 410. The pouch 410 may include multiple layers, such as an inner layer formed of cast polypropylene (CPP), an intermediate layer formed of aluminum, and an outer layer formed of nylon. The pouch 410 may include a lower portion 411 having a receiving groove 411a to receive the electrode assembly 321, and an upper portion 412 that is thermally adhered to the lower film 411. Insulating tapes 421 are used to insulate the positive and negative electrode tabs 321d and 321e, from the intermediate layer of the pouch 410. A contact portion 411b is formed where the upper and lower portions 412 and 411 are sealed together. Then, the contact portion 411b is folded, to form a folded portion 413, as shown in FIG. 4A.

The secondary battery pack 400 includes a coupling member 330 that couples the secondary battery 420 to the loop antenna 130. The coupling member 330 may be a double coated adhesive tape or an adhesive layer. The protective circuit module 310 includes an insulating substrate 311, a printed circuit pattern (not shown), a charging/discharging terminal 313, and a protection circuit part 314. The loop antenna 130 may be inserted into the protection circuit substrate 310, and may be attached to a surface 400a of the pouch 400. The negative electrode tab 321d and the positive electrode tab 321e are electrically connected to the protective circuit module 310.

In the secondary battery pack 400, the loop antenna 130 is attached to the surface 410a of the pouch 420, so that its coupling force is increased. Also, when the secondary battery pack 400 is formed by injection molding, its structure is more flexible than that of a can-type secondary battery. Accordingly, it is possible to form a battery pack having RFID functionalities, and a changeable mounting type.

In a protective circuit module of the present invention, a loop antenna is connected to a printed circuit pattern that is disposed among layers of an insulating substrate. This structure increases the coupling force between the insulating substrate and the loop antenna, thereby reducing contact errors and preventing an increase in contact resistance.

Figure 5A:
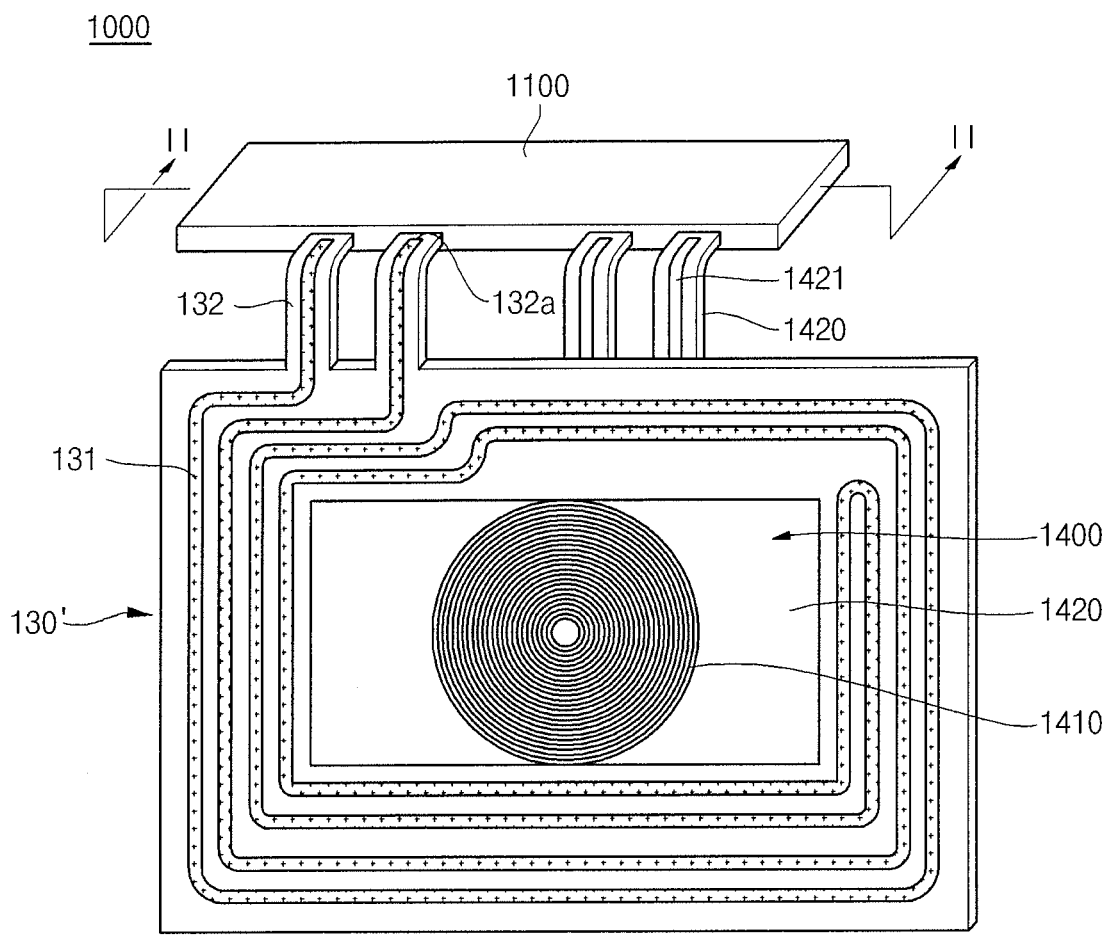
FIG. 5A is a perspective view of a protective circuit module, in accordance with still another embodiment of the present invention.
Figure 5B:
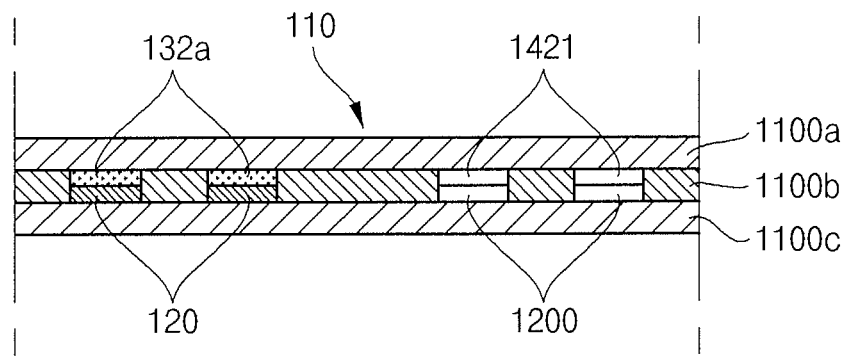
FIG. 5B is a cross-sectional view taken along line II-II of FIG. 5A.

As shown in FIGS. 5A and 5B, according to one embodiment of the present invention, the protective circuit module 1000 includes an insulating substrate 1100, first and second printed circuit patterns 120 and 1200, a loop antenna 130 and a wireless charging portion 1400.

Like the insulating substrate 110 shown in FIGS. 1A and 1B, the insulating substrate 1100 may be formed by stacking a plurality of layers 1100a, 1100b and 1100c and may be made of epoxy or Bakelite resin based material, but embodiments of the present invention are not limited thereto.

Like the printed circuit pattern 120 shown in FIGS. 1A and 1B, the first printed circuit pattern 120 may be located between each of the plurality of layers 1100a, 1100b and 1100c of the insulating substrate 1100.

The second printed circuit pattern 1200 may be located between (or among) layers 1100a, 1100b and 1100c of the insulating substrate 1100. According to one embodiment of the present invention, the second printed circuit pattern 1200 is spaced apart from the first printed circuit pattern 120 between each of the plurality of layers 1100a, 1100b and 1100c of the insulating substrate 1100. In addition, the second printed circuit pattern 1200 may be formed of a conductive film, such as a copper film (or foil), or the like. In addition, the second printed circuit pattern 1200 may be formed on upper and lower surfaces of the insulating substrate 1100 to form a pattern for soldering an electric device. In one embodiment of the present invention, the second printed circuit pattern 1200 in the form of a conductive film is mounted while the plurality of layers 1100a, 1100b and 1100c of the insulating substrate 1100 are stacked and then compressed while heat is applied to the upper and lower surfaces of the insulating substrate 1100, thereby bonding the second printed circuit pattern 1200 to the insulating substrate 1100 with a strong coupling force.

Like the loop antenna shown in FIGS. 1A and 1B, the loop antenna 130' shown in the embodiment of FIG. 5A may be electrically connected to the first printed circuit pattern 120 located between each of the plurality of layers 1100a, 1100b and 1100c of the insulating substrate 1100. In addition, the loop antenna 130' may be a radio frequency identification (RFID) antenna. The loop antenna 130' may be coated on a first insulation film 132 to function. The first insulation film 132 is formed by coating a conductive wire or a conductive copper foil 131 in the form of a very thin film, thereby reducing a mounting volume.

The wireless charging portion 1400 is electrically connected to the second printed circuit pattern 1200 located between the layers 1100a, 1100b and 1100c of the insulating substrate 1100. The wireless charging portion 1400 may include a conductive coil 1410 and may be surrounded by the loop antenna 130'. The wireless charging portion 1400 generates RF alternating current induced according to the magnetic flux linkage generated from a primary coil located at a charging terminal of an external charger. An electrical connection between the wireless charging portion 1400 and the second printed circuit pattern 1200 may be achieved by coupling (or compressing) the wireless charging portion 1400 to the second printed circuit pattern 1200. In addition, ends of the wireless charging portion 1400 (e.g., ends of the conductive coil 1410) are electrically connected to the second printed circuit pattern 1200.

The wireless charging portion 1400 may be coated with a second insulation film 1420 to function as an insulator. In one embodiment, the second insulation film 1420 is formed by coating a conductive wire or a conductive copper foil 131 in the form of a very thin film, thereby reducing a mounting volume.

The first and second insulation films 132 and 1420 may be formed of a polyethylene or polypropylene resin, however, embodiments of the present invention are not limited thereto. In addition, the first and second insulation films 132 and 1420 may be formed of different (e.g., separate) films or a single film.

In embodiments in which the first and second insulation films 132 and 1420 are formed of different films, the ends of the wireless charging portion 1400 are positioned on the lower surface of the first insulation film 132 formed on a lower surface of the loop antenna 130'. In other words, in order to prevent or reduce the risk that the ends of the wireless charging portion 1400 and the loop antenna 130' from contacting and interfering each other, the ends of the wireless charging portion 1400 may be disposed to pass the lower surface of the loop antenna 130'. Alternatively, the second insulation film 1420 formed below the ends of the wireless charging portion 1400 may be disposed to pass an upper surface of the loop antenna 130' (e.g., the second insulation film 1420 may be between the ends of the wireless charging portion 1400 and the loop antenna 130').

In embodiments in which the first and second insulation films 132 and 1420 are formed of a single film, the ends of the wireless charging portion 1400 are positioned on the upper portion of the loop antenna 130', and a separate, third insulation film may be formed below the ends of the wireless charging portion 1400. In other words, the separate third insulation film may further be interposed between the ends of the wireless charging portion 1400 and the loop antenna 130' to be electrically insulated from each other.

Figure 6:
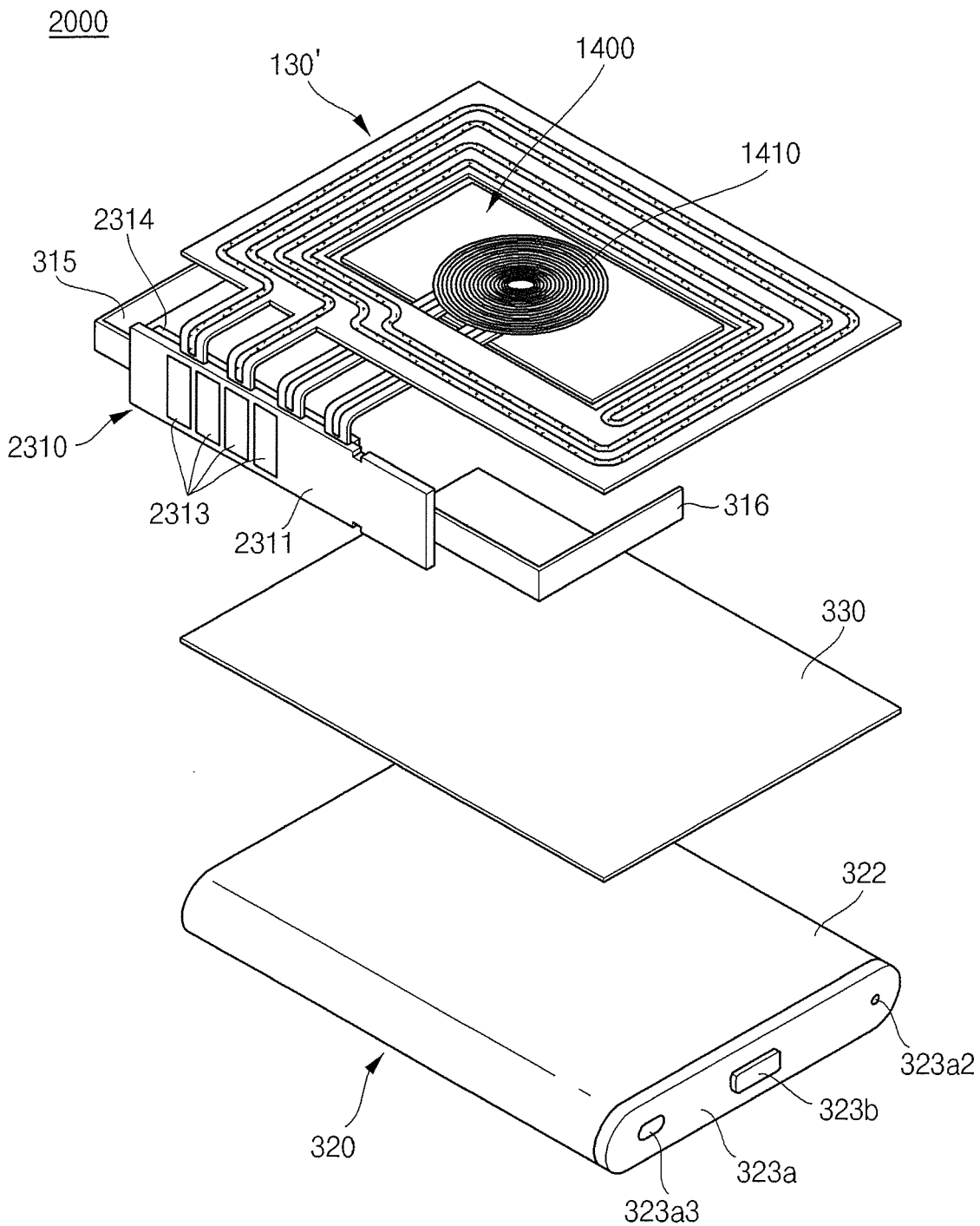
FIG. 6 is an exploded perspective view of a secondary battery pack in accordance with still another exemplary embodiment of the present invention.
Figure 7:
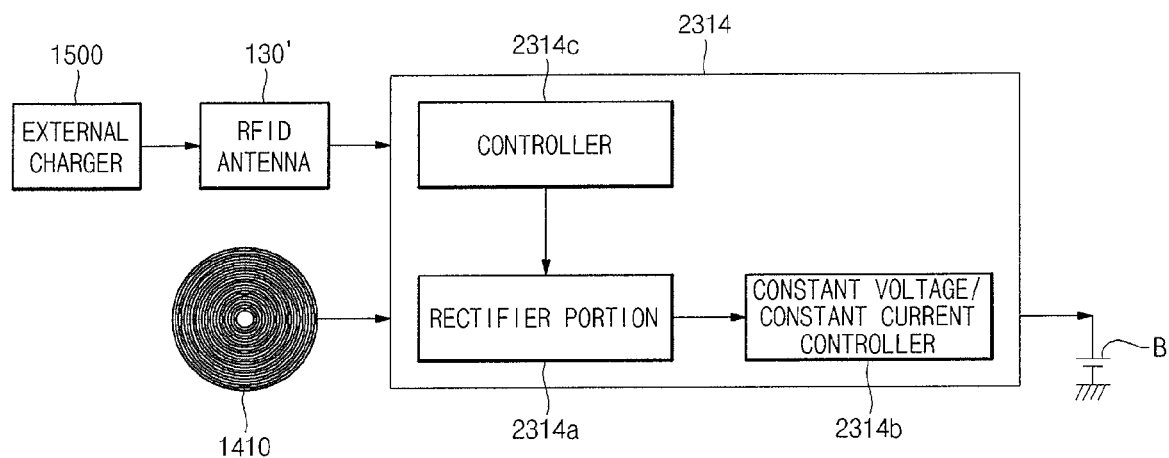
FIG. 7 is a block diagram illustrating a protective circuit module coupled with a wireless charging portion of FIG. 6.

As shown in FIGS. 6 and 7, the secondary battery pack 2000 according to still another embodiment of the present invention using the protective circuit module may include a protective circuit module 2310, a can-type secondary battery 320, and a coupling member 330.

The protective circuit module 2310 includes an insulating substrate 1100, first and second printed circuit patterns, a charging/discharging terminal 2313, a protection circuit part 2314, a loop antenna 130', and a wireless charging portion 1400.

Like the insulating substrate shown in FIGS. 5A and 5B, the insulating substrate 1100 may be formed by stacking a plurality of layers.

As described above with reference to FIGS. 5A and 5B, the first and second printed circuit patterns 120 and 1200 may be located between (or among) the plurality of layers of the insulating substrate 1100. In addition, the first and second printed circuit patterns 120 and 1200 may be formed on upper and lower surfaces of the insulating substrate 1100 and electrically connected to each other. In other words, the first and second printed circuit patterns 120 and 1200 can be bonded to the loop antenna 130' and the wireless charging portion 1400 with a strong coupling force and can form paths to which multiple electrical devices are electrically connected.

The charging/discharging terminal 2313 may be formed on the upper surface of the insulating substrate 1100 and may be electrically connected to the first and second printed circuit patterns 120 and 1200. The charging/discharging terminal 2313 may have four terminal surfaces. In one embodiment, two of the four terminal surfaces are respectively connected to positive and negative electrodes of the can-type secondary battery 320 and the other two may be used as a connection terminal and a ground terminal to sense information and temperature of battery.

As described above with reference to FIGS. 3A and 3B, the protection circuit part 2314 may include a passive element, an active element, and a protection circuit and may be electrically connected (e.g., soldered) to the first and second printed circuit patterns 120 and 1200. In addition, as shown in FIG. 7, the protection circuit part 2314 may include a rectifier portion 2314a and a constant voltage/constant current controller 2314b and may supply a charging voltage transmitted through the external charger 1500 to the can-type secondary battery 322. The rectifier portion 2314a converts the RF alternating current (AC) induced according to the magnetic flux linkage generated from the primary coil formed at the charging terminal of the external charger 1500 into direct current (DC) after receiving the RF alternating current from a secondary coil (e.g., the wireless charging portion 1400, which includes the conductive coil 1410). The constant voltage/constant current controller 2314b applies the direct current rectified by the rectifier portion 2314a to a battery cell B of the can-type secondary battery 322. In addition, the protection circuit part 2314 further includes a controller 2314c configured to control the operation of the rectifier portion 2314a. In other words, the controller 2314c may control the operation of the rectifier portion 2314a by turning the rectifier portion 2314a on/off based on the information associated with (e.g., received from) the external charger 1500 identified by the RFID antenna 130' when the RFID antenna of the loop antenna 130' and the external charger 1500 contact or are in proximity with each other.

As described above with reference to FIGS. 5A and 5B, the loop antenna 130' is electrically connected to the first printed circuit pattern 120 located between the plurality of layers of the insulating substrate 1100. When the loop antenna 130' makes contact (or comes into proximity) with the external charger 1500, it receives the information associated with the external charger 1500. The loop antenna 130' transmits the received information to the controller 2314c and the controller 2314*c* controls the operation of the rectifier portion 2314*a* (e.g., in accordance with the received information), thereby allowing the wireless charging portion 1400 to perform charging. For example, the controller 2314*c* may turn on the rectifier portion 2314*a* when an authorized external charger 1500 is detected and to turn off the rectifier portion 2314*a* when no authorized external charger 1500 (or an unauthorized external charger) is detected.

As described above with reference to FIGS. 5A and 5B, the wireless charging portion 1400 is electrically connected to the second printed circuit pattern 1200 located between the plurality of layers of the insulating substrate 1100.

Figure 8:
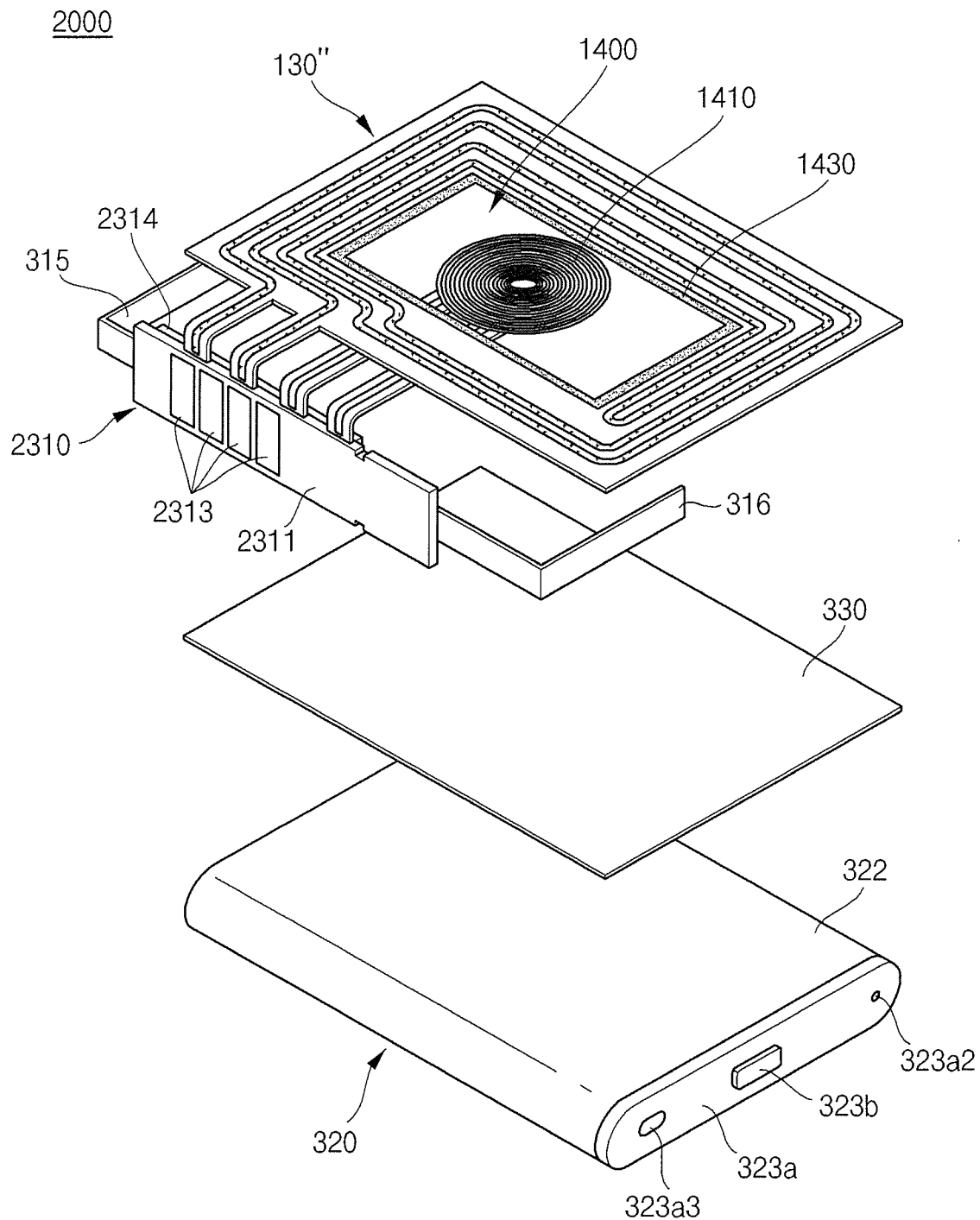
FIG. 8 is an exploded perspective view of a secondary battery pack in accordance with still another exemplary embodiment of the present invention.

In addition, there is a possibility of interference (e.g., electrical interference) due to current flow at an interface area between the wireless charging portion 1400 and the loop antenna 130' surrounding the wireless charging portion 1400. According to one embodiment of the present invention, in order to prevent (or reduce) interference occurring between the wireless charging portion 1400 and the loop antenna 130', as shown in FIG. 8, a conductive pattern 1430 may be located on the first insulation film 132 and/or the second insulation film 1420 located at the interface area (or region or boundary) between the wireless charging portion 1400 and the loop antenna 130'. The conductive pattern 1430 may be formed by coating a conductive material having a thickness (e.g., a predetermined thickness) on the first insulation film 132 and/or the second insulation film 1420, but embodiments of the present invention are not limited thereto. The conductive pattern 1430 may be electrically insulated from the loop antenna 130' and/or the wireless charging portion 1400 and may be grounded so as to reduce or minimize interference of electromagnetic waves.

As described above with reference to FIGS. 3A and 3B, according to one embodiment of the present invention, the can-type secondary battery 320 is rechargeable and coupled to the loop antenna 130' and the wireless charging portion 1400 by the coupling member 330. In addition, the positive and negative electrodes of the can-type secondary battery 320 are electrically connected to the protective circuit module 2310 by positive and negative lead tabs 315 and 316.

As shown in FIG. 8, according to one embodiment of the present invention, the coupling member 330 couples the can-type secondary battery 320 to the loop antenna 130" and the wireless charging portion 1400. Here, the coupling member 330 may be formed of a double coated (or double-sided) tape to bond the loop antenna 130" and the wireless charging portion 1400 to the can-type secondary battery 320. In addition, an adhesive may be applied to a wide surface of the can-type secondary battery 320 and the loop antenna 130" and the wireless charging portion 1400 may then be bonded to couple the same to the can-type secondary battery 320.

The secondary battery 300 may provide enhanced coupling of the loop antenna 130", the wireless charging portion 1400, and the can-type secondary battery 320, because the loop antenna 130" and the wireless charging portion 1400 are inserted into a thickness portion of the protective circuit module 2310 while the loop antenna 130", the wireless charging portion 1400, and the can-type secondary battery 320 are coupled together by the coupling member 330. Therefore, the loop antenna 130" and the wireless charging portion 1400 are attached to the wide surface of the can-type secondary battery 320 and then embedded (e.g., during manufacturing) in an injection molding material or other coupling member in a pack shape, thereby achieving secure coupling of the loop antenna 130" and the wireless charging portion 1400 to the strength of the can-type secondary battery 320 in a metal can. In addition, the loop antenna 130" and the wireless charging portion 1400 are both mounted in the can-type secondary battery, thereby providing wireless charging in an optimal state of battery.

Although a few exemplary embodiments of the present invention have been shown and described, it would be appreciated by those skilled in the art that changes may be made in these embodiments, without departing from the principles and spirit of the invention, the scope of which is defined in the claims and their equivalents.

What is claimed is:

1. A protective circuit module comprising:
   an insulating substrate comprising a plurality of layers;
   first and second printed circuit patterns disposed between the plurality of layers of the insulating substrate;
   a loop antenna electrically coupled to the first printed circuit pattern; and
   a wireless charging portion spaced apart from the loop antenna and electrically coupled to the second printed circuit pattern,
   wherein ends of the loop antenna and ends of the wireless charging portion are between the plurality of layers of the insulating substrate.

2. The protective circuit module as claimed in claim 1, wherein the wireless charging portion comprises a conductive coil.

3. The protective circuit module as claimed in claim 1, wherein the loop antenna and the wireless charging portion are located on the first and second insulation films, respectively.

4. The protective circuit module as claimed in claim 3, wherein the ends of the wireless charging portion are located on a lower surface of the first insulation film.

5. The protective circuit module as claimed in claim 3, wherein the second insulation film is located on an upper surface of the loop antenna.

6. The protective circuit module as claimed in claim 3, further comprising a conductive pattern located at a region of the first or second insulation film between the loop antenna and the wireless charging portion.

7. The protective circuit module as claimed in claim 1, wherein the loop antenna and the wireless charging portion are located on one of the first and second insulation films.

8. The protective circuit module as claimed in claim 7, wherein the ends of the wireless charging portion are located on the upper surface of the loop antenna and a third insulation film is located below the ends of the wireless charging portion.

9. The protective circuit module as claimed in claim 8, wherein the ends of the wireless charging portion are located on the upper surface of the loop antenna and an insulation film is located on lower surfaces of the ends of the wireless charging portion.

10. A secondary battery pack, comprising:
    a protective circuit module comprising:
      an insulating substrate comprising a plurality of layers;
      first and second printed circuit patterns disposed between the plurality of layers of the insulating substrate;
      a charging/discharging terminal mounted on the insulating substrate and electrically coupled to the first and second printed circuit patterns;
      a protection circuit part mounted on the insulating substrate and electrically coupled to the first and second printed circuit patterns;
      a loop antenna electrically coupled to the first printed circuit pattern; and a wireless charging portion spaced apart from the loop antenna and electrically coupled to the second printed circuit pattern;

a secondary battery electrically coupled to the protection circuit module; and a coupling member coupling the loop antenna and the wireless charging portion to the secondary battery, wherein ends of the loop antenna and ends of the wireless charging portion are between the plurality of layers of the insulating substrate and connected to the first and second printed circuit patterns.

11. The secondary battery pack as claimed in claim 10, wherein the wireless charging portion comprises a conductive coil.

12. The secondary battery pack as claimed in claim 10, wherein the loop antenna and the wireless charging portion are located on first and second insulation films, respectively.

13. The secondary battery pack as claimed in claim 12, wherein the ends of the wireless charging portion are located on a lower surface of the first insulation film.

14. The secondary battery pack as claimed in claim 12, wherein the ends of the wireless charging portion are located on an upper surface of the second insulation film of the loop antenna.

15. The secondary battery pack as claimed in claim 12, further comprising a conductive pattern located at a region of the first or second insulation film positioned between the loop antenna and the wireless charging portion.

16. The secondary battery pack as claimed in claim 10, wherein the loop antenna and the wireless charging portion are located on one of the first and second insulation films.

17. The secondary battery pack as claimed in claim 16, wherein the ends of the wireless charging portion are located on the upper surface of the loop antenna and a third insulation film is located below the ends of the wireless charging portion.

\* \* \* \* \*